United States Patent [19]

Frentzel et al.

[11] Patent Number: 5,112,687
[45] Date of Patent: May 12, 1992

[54] HIGHLY CONDUCTIVE POLYMER THICK FILM COMPOSITIONS

[75] Inventors: Richard L. Frentzel, Chino Hills; Andrew Chen, Covina, both of Calif.

[73] Assignee: Advanced Products Inc., Cheshire, Conn.

[21] Appl. No.: 767,768

[22] Filed: Sep. 30, 1991

Related U.S. Application Data

[62] Division of Ser. No. 518,052, May 2, 1990, Pat. No. 5,089,173.

[51] Int. Cl.⁵ .................................. B32B 5/16
[52] U.S. Cl. ........................... 428/402; 428/423.1; 428/483; 428/901
[58] Field of Search ............... 428/402, 483, 423.1, 428/901

[56] References Cited

U.S. PATENT DOCUMENTS

| | | | |
|---|---|---|---|
| 4,371,459 | 2/1983 | Nazarenko | 252/514 |
| 4,425,263 | 1/1984 | Nazarenko | 252/511 |
| 4,518,524 | 5/1985 | Stoetzer | 252/514 |
| 4,535,012 | 8/1985 | Martin | 427/386 |
| 4,552,690 | 11/1985 | Ikeguchi et al. | 252/512 |
| 4,564,563 | 1/1986 | Martin et al. | 428/546 |
| 4,595,604 | 6/1986 | Martin et al. | 427/96 |
| 4,595,605 | 6/1986 | Martin et al. | 427/96 |
| 4,595,606 | 6/1986 | St. John et al. | 252/511 |

OTHER PUBLICATIONS

Union Carbide Product Data Sheet for VMCA Vinyl Acetage/Vinyl Chloride/Maleic Acid Tripolymer.
B.F. Goodrich Product Data Sheet for ESTANE 5703 Polyurethane Resin.
B.F. Goodrich Product Data Sheet for VITEL PE-222 Polyester Resin.
D. Bowns "Specialty Inks for Membrane Switches", Screen Printing, May, 1983.

*Primary Examiner*—Edith L. Buffalow
*Attorney, Agent, or Firm*—William A. Simons

[57] ABSTRACT

A thermally curable conductive polymer thick film composition comprising, by weight:
(a) about 3-15 parts of at least one thermoplastic vinyl acetate/vinyl chloride/dicarboxylic acid multipolymer resin;
(b) a second thermoplastic resin selected from the group consisting of:
  (i) about 1-6 parts of at least one thermoplastic polyurethane resin;
  (ii) about 2-10 parts of at least one thermoplastic polyurethane resin;
  (iii) about 1-10 parts of a mixture of at least one thermoplastic polyurethane and at least one thermoplastic polyester resin;
(c) about 0.05-1 parts of a tertiary amine;
(d) an effective amount of at least one organic solvent capable of substantially dissolving (a), (b), and (c) ingredients; and
(e) about 50-80 parts of silver flake.

2 Claims, No Drawings

HIGHLY CONDUCTIVE POLYMER THICK FILM COMPOSITIONS

This application is a division of application Ser. No. 07/518,052 filed May 2, 1990 now U.S. Pat. No. 5,089,173.

BACKGROUND OF THE INVENTION 1. Field of the Invention

The present invention relates to highly conductive polymer thick film compositions containing selected thermoplastic polymers, a tertiary amine, and a conductive silver flake filler. 2. Description of the Prior Art The circuit patterns for membrane touch switches are usually made from a thermoplastic polymer thick film (PTF) composition containing particles of a conductive material dispersed in a volatile organic solvent-resin medium. The uncured PTF composition is usually screen-printed in the desired circuiting Pattern onto a substrate which may be either made from a rigid or flexible material. The PTF composition is then cured or dried, normally by the application of heat, and the volatile organic solvent material in the solvent-resin component is driven off. The curing causes the bonding of cured resin system with the conductive particles, thus forming the electrically active pattern for the membrane touch switches.

Numerous thermoplastic PTF compositions have been made for this and other applications.

For example, U.S. Pat. No. 4,371,459, which issued to Nazarenko on Feb. 1, 1983, teaches a screen printable PTF composition useful for making membrane touch switches comprising:
  (a) 70-90% by weight, basis total solids, of a conductive phase consisting essentially of finely divided particles of:
    (1) 50-95% by weight silver; and
    (2) 20-5% by weight a base metal (i.e. Al, Sn, or Ni or mixtures thereof);
  (b) 30-10% by weight, basis total solids, of polymers consisting essentially of:
    (1) 10-65% by weight of a multipolymer prepared by copolymerization of vinyl acetate, vinyl chloride, and 0.3-10% by weight of an ethylenically unsaturated dicarboxylic acid in which the weight ratio of vinyl chloride to vinyl acetate is from 3 to 8; and
    (2) 90-35% by weight of a linear aromatic polyester resin having an intrinsic viscosity of 0.5 to 1 dissolved in
  (c) a volatile nonhydrocarbon polar solvent having a boiling range of 150°-220° C.

Also, U.S. Pat. No. 4,425,263, which issued to Nazarenko on Jan. 10, 1984, teaches a screen-printable PTF composition useful for making membrane touch switches which consists essentially of:
  (a) 30-80% by weight of finely divided metal particles (including silver flake) and
  (b) 70-20% by weight of an organic medium which is a solution of:
    (1) a linear aromatic polyester resin having an intrinsic viscosity of 0.5 to 1 completely dissolved in
    (2) a volative nonhydrocarbon solvent having a boiling point of 150°-220° C.;
wherein the weight ratio of resin to solvent is from 0.15 to 0.5:1.

U.S. Pat. No. 4,518,524, which issued to Stoetzer on May 21, 1985, teaches a PTF composition useful as a conductive coating comprising:
  (a) a silver pigment material;
  (b) a ferro alloy pigment material;
  (c) a binder resin selected from thermoplastic acrylic, vinyl, urethane, alkyl, polyester, hydrocarbon, fluoroelastomer and cellulosic resins, and thermosetting acrylic polyester epoxy, phenolic, urethane, and alkyl resins; and
  (d) organic solvent carrier.

U.S. Pat. No. 4,535,012, which issued to Martin on Aug. 13, 1985, teaches a conductive PTF composition useful as solderable printed circuit comprising:
  (a) silver particles;
  (b) a reactive resin mixture comprising a carboxylated vinyl resin and a moderate chain length epoxy dissolved in:
  (c) an organic solvent (e.g., ester alcohol).

U.S. Pat. No. 4,552,690, which issued to Ikeguchi, et al. on Nov. 12, 1985, teaches a conductive PTF composition comprising:
  (a) 15-35 parts by weight of a selected cyanate ester compound;
  (b) 65-85 parts by weight of an electrically conductive powder, including silver powder;
  (c) 0.5-15 parts by weight of at least one acetylacetone compound;
  (d) optionally, a metal chelate compound;
  (e) optionally, thermosetting resins;
  (f) optionally, thermoplastic resins;
  (g) optionally, rubbers;
  (h) optionally, natural or synthetic inorganic materials;
  (i) optionally, organic solvents;
  (j) optionally, organic acids;
  (k) optionally, inorganic acids;
  (l) optionally, coupling agents;
  (m) optionally, flame retardants;
  (n) optionally, self-extinguishing agents; and
  (o) optionally, catalysts including tertiary amines such as N,N-dimethyl benzylamine, N,N-dimethylaniline, N,N-dimethyltoluidine, N,N-dimethyl-p-anisidine, p-halogen-N,N-dimethylaniline, 2-N-ethylanilino ethanol, tri-n-butylamine, pyridine, quinoline, N-methylvorpholine, triethanolamine, triethylenediamine, N,N,N',N'-tetramethylbutanediamine, and N-methylpiperidine.

U.S. Pat. No. 4,564,563, which issued to Martin, et al. on Jan. 14, 1986, teaches a conductive PTF composition useful as a solderable electric circuit comprising:
  (a) silver particles;
  (b) a reactive resin matrix comprising:
    (1) an acrylic resin (e.g., a methyl/butyl methacrylate copolymer);
    (2) a carboxylated vinyl resin; and
    (3) a moderate chain length epoxy resin; dissolved in
  (c) at least one organic solvent.

U.S. Pat. No. 4,595,604, which issued to Martin, et al. on Jun. 17, 1986, teaches a conductive PTF composition useful as solderable and flexible printed circuit boards and membrane key boards comprising:
  (a) silver particles;
  (b) a reactive resin system made from:
    (1) a vinyl chloride/vinyl acetate copolymer having no carboxylic acid groups (e.g., VYHH);
    (2) epoxy resin; and (3) an epoxy hardener, dissolved in:

(c) a mixture of a ketone solvent and an ester solvent.

U.S. Pat. No. 4,595,605, which issued to Martin, et al. on Jun. 17, 1986, teaches a conductive PTF composition useful as solderable and flexible printed circuit boards and membrane key boards comprising:

(a) from about 88 to about 93% by weight, after curing, silver flake having an average particle size of about 0.5 to about 50 microns;

(b) about 7 to about 12% by weight vinyl chloridevinyl acetate copolymer, said copolymer having a number average molecular weight from about 14,000 to about 35,000 and containing no carboxylic acid groups;

(c) a solvent (e.g., gamma butyolactone, acetone, or cyclohexane).

U.S. Pat. No. 4,595,606, which issued to St. John, et al. on Jun. 17, 1986, teaches conductive PTF compositions useful for application to printed circuit boards consisting essentially of:

(a) 80-85% silver flake having an average particle size from about 0.5 to about 50 microns;

(b) a resin system consisting essentially of:
  (1) about 0.6-1.6% by weight phenolic resin;
  (2) about 0.8-1.6% by weight acrylic resin;
  (3) about 0.4-0.8% by weight polyurethane resin;
  (4) about 1.2-3.5% by weight vinyl chloride/vinyl acetate copolymer;
  (5) about 1.0-3.0% epoxy resin; and
  (6) about 2.5-4.0% epoxy hardener; dissolved in (c) at least one organic solvent.

All of the above-noted U.S. patents are incorporated herein by reference in their entirety.

Ideally, a thermoplastic PTF composition should possess the following combination of properties:

(1) exhibit a relatively long shelf life at room temperature (requires no refrigeration);

(2) require a low curing temperature and short curing times in a convection oven (i.e., no higher than 130° for no longer than 60 minutes) so as to not adversely affect the substrate;

(3) be very conductive (or have very low electrical resistivity i.e., less than 0.015 ohms/sq./mil);

(4) be sufficiently flexible when cured to be applied to flexible substrate (or substrates which might flex during their operation);

(5) have acceptably good adhesion to membrane touch switch substrate (e.g., polyester films) when cured;

(6) be easily prepared; and (7) be inexpensively applied to a substrate and cured without needing a complicated procedure.

The thermoplastic PTF compositions of the present invention are believed to have this desired combination of properties.

BRIEF SUMMARY OF THE INVENTION

Accordingly, the present invention is directed to a thermally curable thermoplastic polymer thick film composition comprising, by weight:

(a) about 3-15 parts of at least one vinyl acetate/vinyl chloride/dicarboxylic acid multipolymer resin;

(b) a second thermoplastic resin selected from the group consisting of:
  (i) about 1-6 parts of at least one thermoplastic polyurethane resin;
  (ii) about 2-10 parts of at least one thermoplastic polyester resin; or
  (iii) about 1-10 parts of a mixture of at least one thermoplastic polyurethane and at least one thermoplastic polyester resin;

(c) about 0.05-1 parts of a tertiary amine;

(d) an effective amount of at least one organic solvent capable of substantially dissolving (a), (b), and (c) ingredients; and (e) about 50-80 parts of silver flake.

Furthermore, the present invention is also directed to a method of Preparing a polymer thick film on a substrate comprising the steps of:

(1) providing a polymer thick film composition as defined above;

(2) applying said composition to a substrate; and (3) thermally curing said composition on said substrate.

Still further, the present invention is directed to a thermally cured thermoplastic polymer thick film composition comprising, by weight, a cured admixture of:

(a) about 3-15 parts of at least one thermoplastic vinyl acetate/vinyl chloride/dicarboxylic acid multipolymer resin;

(b) a second thermoplastic resin selected from the group consisting of:
  (i) about 1-6 parts of at least one thermoplastic polyurethane resin;
  (ii) about 2-10 parts of at least one thermoplastic polyester resin; or
  (iii) about 1-10 parts of a mixture of at least one thermoplastic polyurethane resin and at least one thermoplastic polyester resin;

(c) about 0.05-1 parts of at least one tertiary amine; and (d) about 50-80 parts of silver flake.

And even further, the present invention is directed to a substrate having a cured conductive polymer thick film coating thereon as defined above.

DETAILED DESCRIPTION

As stated above, the present invention encompasses the combination of five different components in a curable thermoplastic thick film composition; a vinyl acetate/vinyl chloride/dicarboxylic acid multipolymer resin; a second thermoplastic resin which is either a polyurethane resin or a polyester resin; a tertiary amine; an organic solvent; and silver flake.

Any vinyl acetate/vinyl chloride/dicarboxylic acid multipolymer resin is suitable for the present invention. Multipolymers derived by the copolymerization of vinyl acetate, vinyl chloride, and ethylenically unsaturated dicarboxylic acids are particularly preferred for this composition. Such multipolymers may be either block or random copolymers in which the various monomeric units are either in blocks or randomly distributed along the polymer chain.

Though many polymerizable ethylenically unsaturated dicarboxylic acids can be used in the multipolymer, as a practical matter, itaconic acid, fumaric acid, and maleic acid will be most used because of their more favorable polymerization rates and commercial availability.

In addition, it is preferred that the weight ratio of the vinyl chloride monomers to the vinyl acetate monomers be from about 3:1 to 8:1. It will be recognized that minor amounts of additional ethylenically unsaturated monomers such as monocarboxylic acids, and the like, can also be included in the multipolymer. However, they should not constitute more than about 10% by weight of the polymeric units of the polymer chain.

As used herein, the term "multipolymer" includes terpolymers as well as higher multipolymers.

The vinyl chloride/vinyl acetate/dicarboxylic acid multipolymer that may be used in the compositions of the instant invention have a number average molecular weight range of between about 4,000 and 35,000. Preferably, the number average molecular weight of the multipolymer is about 8,000. The lower molecular weight vinyl chloride/vinyl acetate/dicarboxylic acid multipolymer are preferred because they are more soluble in a wide range of solvents commonly used for making PTF compositions.

The preferred weight ratios of vinyl chloride to vinyl acetate to dicarboxylic acid was 77-86:14-20:0.5-3. Although all the examples contained in this specification were all carried out by a vinyl chloride/vinyl acetate/maleic acid terpolymer (weight ratio 81:17:2) designated VMCA supplied by Union Carbide of Danbury, Conn., other types of vinyl chloride/vinyl acetate/dicarboxylic acid multipolymers may be employed as long as the multipolymer conforms to the specifications hereinbefore described.

The preferred amounts of vinyl acetate/vinyl chloride/dicarboxylic acid resin are about 4-12 parts, most preferably 4.5-10 parts, by weight added into the curable PTF composition.

Any thermoplastic polyurethane resin which is soluble in the solvents used for this application may be used as a resin for the Present invention. The preferred thermoplastic polyurethane resin is ESTANE 5703 linear aliphatic polyester polyurethane resin available from B. F. Goodrich Company, Chemical Group, of Cleveland, Ohio. This resin is preferred because of its good flexibility and elongation properties.

The preferred amounts of polyurethane resin are from about 2-5 parts, most preferably about 2.5-3.5 parts, by weight added into the curable PTF composition.

Any thermoplastic polyester resin which is soluble in the solvents used for this application may be used herein. The preferred polyester resins which are used in the invention are polycondensation products of a dicarboxylic acid such as isophthalic or terphthalic acid or an aliphatic acid or both with a $C_{2-5}$ dihydroxy alkane such as ethylene, propylene glycol, or neopentyl glycol.

A preferred linear aromatic thermoplastic polyester resin is one sold by Goodyear Tire and Rubber Company, Akron, Ohio as VITEL® linear thermoplastic polyester resin, grade number PE-222. This linear thermoplastic polyester resin is preferred because of its solubility properties and its glass transition temperature of 47° C.

The preferred amounts of polyester resin are about 3-7 parts, most preferably about 3.5-6 parts, by weight added into the curable PTF composition.

Any tertiary amine may be used in the composition of the present invention. Preferred tertiary amines include: N,N-dimethyl benzylamine, N,N-dimethylaniline, N,N-dimethyltoluidine, N,N-dimethyl-p-anisidine, p-halogen-N,N-dimethylaniline, 2-N-ethylanilino ethanol, tri-n-butylamine, pyridine, quinoline, N-methylvorpholine, triethanolamine, triethylenediamine, N,N,N',N'-tetramethylbutanediamine, N-methylpiperidine. The most preferred tertiary amine is triethanolamine.

The preferred amount of tertiary amine added is from about 0.1-0.75 parts, most preferably about 0.1-0.5 parts, by weight added into the curable PTF composition.

Preferred organic solvents for thick film applications include nonhydrocarbon polar organic solvents such as carbitol, carbitol acetate, butyl carbitol, butyl carbitol acetate, butyolactone, acetone, methyl ethyl ketone, cyclohexanone, dibasic ester solvent, diglyme, and high boiling alcohols and alcohol esters. Various combinations of these and other solvents are formulated to obtain the desired viscosity and volatility requirements for each application. For screen printing applications, the solvent or solvents chosen should preferably have a boiling point from about 150° C. to 240° C.

The preferred amount of solvent is from about 20-40 parts by weight, most preferably from about 25-35 parts, added into the curable PTF composition.

Any silver flake may be suitable as the conductive filler for the present PTF composition. The preferred silver flake used will depend upon the particular resin system, tertiary amine and solvent employed as well as the specific application for which the PTF will be used. The term "silver flake" means herein a silver powder whose predominant shape is flakes as determined by scanning electron microscopy. Such silver flakes typically have a surface area of approximately 0.8-1.40 $m^2/g$ and over 99% by weight purity. These silver flakes generally have an average particle size of less than 50 microns.

The preferred amount of silver flake is about 52-75 parts, most preferably about 55-70 parts, by weight added into the curable PTF composition.

The curable PTF composition of the present invention may preferably also contain other minor ingredients. Such optional ingredients include other conductive fillers, other thermoplastic resins, rubbers, and flow agents.

Optional other conductive fillers include other metal powders and flakes, graphite, and carbon black. If used, such other fillers may be preferably employed in amounts from about 0.05 to 10 parts by weight of the total curable PTF composition.

Optional other thermoplastic resins include thermoplastic acrylic, alkyl, hydrocarbon, and fluroelastomer resins. If used, these other thermoplastic resins may be preferably employed in amounts from 0.05 to 5 parts by weight of the curable PTF composition.

Optional rubbers include polybutadiene, butadiene-acrylonitrile copolymers, polyisoprene, butyl rubber, natural rubbers, and the like. If used, the amount of such rubbers may be preferably employed in amounts from 0.5 to 5 parts by weight of the curable PTF composition.

Optional flow additives include silicon polymers, ethyl acrylate/2-ethylhexyl acrylate copolymers, and an alkylol ammonium salt of acidic phosphoric acid esters of ketoxime. Mixtures of flow agents may be employed.

If used, the flow additive is preferably employed in amounts from about 0.5 parts to about 2 parts by weight.

The components of the present conductive PTF composition may be mixed together by any conventional means. Preferably, it is desirable to first mix the vinyl acetate/vinyl chloride/dicarboxylic acid multipolymer resin or resins with the solvent or solvents in a conventional mixing apparatus equipped with agitation means. The tertiary amine is then mixed in and the resulting mixture is allowed to stand for one or two days to insure complete neutralization of the acid groups in the multipolymer. This is preferably followed by adding either the polyurethane or polyester resins or mixtures thereof which have also been dissolved in solvent along with the silver flake as well as any minor preferred components to the apparatus while continuing the agitation. After the last component has been added, the agitation should be continued until a uniform mixture is obtained. This mixture may than be preferably placed in a three-roll mill or another suitable milling machine to obtain a fineness of grind of the composition of under about 30 microns.

The compositions of this invention may be applied to substrates by a variety of techniques, such as screen printing, spraying, or brushing. Once the conductive PTF composition has been applied to the substrate, it is dried and cured by exposing it and the substrate to elevated temperatures one or more times. The preferred curing, in a convection oven, is at temperatures from about 110° C. to about 150° C. for times from about 5 minutes to 30 minutes. Any conventional PTF Curing apparatus may be used.

When the mixture of multipolymer resin or resins with the polyurethane or polyester resin or resins are thermal cured, it is believed that the unexpected high conductivity of the cured product results from a reaction of tertiary amine with the acid groups in the multipolymer, causing the formation of ionic groups in the cured resin system. The presence of these ionic groups are believed to cause the desired excellent conductivity. This reactive mechanism is not fully understood and the present invention should not be limited to any particular reaction mechanism.

The conductive composition of the present invention may be applied to conventional rigid or flexible substrates. Whether the substrate is flexible or rigid in nature, the substrate may or may not have to be pretreated or precoated with any other substance before applying the present curable PTF compositions.

The conductive compositions of the present invention are flexible and as such, they may be applied to a flexible substrate such as, for example, polyester films. Examples of flexible substrates that may be coated with the conductive compositions of the present invention are polyester substrates such as those made by E. I. DuPont de Nemours Company and sold under the trademark MYLAR ®. Of course, other materials such as polycarbonate film or polyvinyl fluoride (PVF) film may be used as a substrate.

The term "flexible" as presently employed in this specification and claims is used to mean when the composition of the present invention may be subjected to deformative forces (e.g., twisting or bending) and will not release from the substrate or crack or break. The composition, in its deformed state, will function as well as the composition in its undeformed state. The most severe form of deformation would be to put a crease in the composition. This may be accomplished by a 180 degree angle fold of the composition and substrate. A flexible composition like those of the present invention will function well under this condition. If the composition cracks or breaks as the result of being distorted, the composition would not be considered flexible; cracks in the composition cause a severe decrease in conductivity and other electrical and mechanical properties.

The preferred substrates are those from which membrane touch switches are made.

The following Examples and Comparisons further illustrate the Present invention. All percentages and parts are by weight unless explicitly stated otherwise.

EXAMPLES 1 AND 2 AND COMPARISONS 1 AND 2

Four silver/polymer compositions having the components (and their parts by weight) listed in Table I below, were prepared by first dissolving the vinyl acetate/vinyl chloride/maleic acid tripolymer in a portion of the carbitol acetate solvent. For Examples 1 and 2 (Ex-1 and Ex-2), the triethanolamine was then mixed in and the resultant mixture was allowed to stand for one or two days to insure complete neutralization of the acid groups in the tripolymer. Next, either the polyurethane resin or the polyester resin was first dissolved in the balance of the solvent and then was added to the above mixture while mixing in the Cowles mixer. The silver flake was then added, and the complete composition was continued to be mixed for several minutes. The mixture was then transferred to a 3-roll mill and roll milled until a fine, uniform dispersion of less than 30 microns was obtained.

The resultant curable PTF composition was screen printed in the form of an electrical circuit onto a polyester substrate and placed into a convection oven at about 110° C. for 10 minutes. After this curing, the surface resistivity of each screen-printed circuit was measured in ohms/sq./mil. Those measured results are given in Table II below.

As can be seen, the addition of the tertiary amine in Examples 1 and 2 resulted in significant lowering of the surface resistivity over the similar PTF compositions shown in Comparisons 1 and 2 which do not contain the tertiary amine. The results show that the compositions of Examples 1 and 2 would be much more acceptable for use in membrane touch switch applications than the compositions of comparisons 1 and 2.

TABLE I

| Component | Parts by Weight | | | |
|---|---|---|---|---|
| | Ex-1 | C-1 | Ex-2 | C-2 |
| Vinyl acetate/vinyl chloride/ maleic acid terepolymer (A) | 6.45 | 6.47 | 5.0 | 5.0 |
| Polyurethane resin (B) | 2.75 | 2.76 | — | — |
| Polyester resin (C) | — | — | 5.0 | 5.0 |
| Triethanolamine | 0.33 | 0 | 0.12 | 0 |
| Carbitol acetate (D) | 33.1 | 33.2 | 28.4 | 26 |
| Silver flake | 57.4 | 57.6 | 61.5 | 63.2 |

(A) VMCA copolymer available from Union Carbide, Danbury, CT.
(B) ESTANE 5703 available from B. F. Goodrich, Cleveland, OH.
(C) VITEL PE-222 available from Goodyear Tire & Rubber Co. of Akron, OH.
(D) Also known as diethylene glycol monoethylether acetate available from Union Carbide, Danbury, CT.

TABLE II

| Example or Comparison | Surface Resistivity (ohms/sq./mil) |
|---|---|
| Ex-1 | 0.009 |
| C-1 | 0.022 |
| Ex-2 | 0.009 |
| C-2 | 0.027 |

What is claimed is:

1. A substrate having a cured conductive polymer thick film coating thereon which comprises, by weight, a cured admixture of:

(a) about 3–15 parts of at least one thermoplastic vinyl acetate/vinyl chloride/dicarboxylic acid multipolymer;

(b) a second thermoplastic resin selected from the group consisting of:
  (i) about 1-6 parts of at least one thermoplastic polyurethane resin;
  (ii) about 2-10 parts of at least one thermoplastic polyester resin; or
  (iii) about 1-10 parts of a mixture of at least one thermoplastic polyurethane and at least one polyester resin;
(c) about 0.05-1 parts of a tertiary amine; and
(d) about 50-80 parts of silver flake.

2. The coated substrate of claim 1, wherein said substrate is a membrane touch switch substrate.

* * * * *